(12) United States Patent
Matsuo

(10) Patent No.: US 8,569,796 B2
(45) Date of Patent: Oct. 29, 2013

(54) SEMICONDUCTOR WAFER AND SEMICONDUCTOR DEVICE HAVING MULTILAYERED NITRIDE SEMICONDUCTOR LAYER

(75) Inventor: Tetsuji Matsuo, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 35 days.

(21) Appl. No.: 13/314,466

(22) Filed: Dec. 8, 2011

(65) Prior Publication Data
US 2012/0181577 A1    Jul. 19, 2012

(30) Foreign Application Priority Data
Jan. 14, 2011   (JP) ................................. 2011-005832

(51) Int. Cl.
*H01L 29/06*    (2006.01)
(52) U.S. Cl.
USPC ............. 257/190; 257/13; 257/194; 257/615; 257/E29.024

(58) Field of Classification Search
USPC ............ 257/190, E29.024, 13, E33.008, 751, 257/94, 192
See application file for complete search history.

(56) References Cited

U.S. PATENT DOCUMENTS

2010/0213577 A1 *   8/2010   Kato et al. .................... 257/615

FOREIGN PATENT DOCUMENTS

JP    2008-235709    10/2008

* cited by examiner

*Primary Examiner* — Mamadou Diallo
(74) *Attorney, Agent, or Firm* — Oblon, Spivak, McClelland, Maier & Neustadt, L.L.P.

(57) ABSTRACT

A semiconductor wafer includes a multilayered film having a structure in which nondoped first nitride semiconductor layers and nondoped second nitride semiconductor layers with a larger lattice constant than the first nitride semiconductor layer are laminated alternately, and a nondoped third nitride semiconductor layer which is located on the multilayered film and has a larger lattice constant than the first nitride semiconductor layer, wherein the semiconductor wafer has conductivity in a film-thickness direction.

6 Claims, 5 Drawing Sheets

SEMICONDUCTOR WAFER AND SEMICONDUCTOR DEVICE HAVING MULTILAYERED NITRIDE SEMICONDUCTOR LAYER

CROSS REFERENCE TO RELATED APPLICATIONS AND INCORPORATION BY REFERENCE

This application is based upon and claims the benefit of priority from prior Japanese Patent Application P2011-005832 filed on Jan. 14, 2011; the entire contents of which are incorporated by reference herein.

BACKGROUND OF THE INVENTION

1. Field of the Invention

The present invention relates to a semiconductor wafer and a semiconductor device including a nitride semiconductor layer.

2. Description of the Related Art

Generally, a nitride semiconductor layer is formed on an inexpensive silicon substrate or sapphire substrate. However, the lattice constants of such semiconductor substrates and that of a nitride semiconductor layer are greatly different from each other, and coefficients of thermal expansion thereof also differ from each other. Therefore, a large strain is generated in a nitride semiconductor layer formed by epitaxial growth on a sapphire substrate or a silicon substrate. As a result, the nitride semiconductor device is susceptible to cracks or degradation of the crystal quality. Compared to a sapphire substrate, a crack is especially more serious problem for a silicon substrate because of a sizable lattice mismatch with a nitride semiconductor layer.

In order to have a conductive nitride semiconductor layer, impurity doping into the nitride semiconductor layer is generally used for generating conducting carrier.

However, the crystal of the nitride semiconductor layer is hardened due to the impurity doping, making it more likely to have cracks. Thus, impurity doping into a nitride semiconductor layer formed on a silicon substrate or a sapphire substrate makes designing of devices more difficult due to crystal hardening and degradation of crystal quality.

Moreover, in order to improve element characteristics, it is necessary to increase the film thickness of a semiconductor functional layer such as a nitride semiconductor layer which forms hetero junction where an operating current flows or a nitride semiconductor layer which has a light-emitting function. By increasing the film thickness of the semiconductor functional layer, the crystal quality thereof is improved. Having said that, to increase the film thickness, it is also necessary to increase the film thickness of a buffer layer arranged between the semiconductor functional layer and the semiconductor substrate. Thus, cracks become more serious problems.

SUMMARY OF THE INVENTION

An aspect of the present invention is a semiconductor wafer comprising: a multilayered film having a structure in which nondoped first nitride semiconductor layers and nondoped second nitride semiconductor layers with a larger lattice constant than the first nitride semiconductor layer are laminated alternately, and a nondoped third nitride semiconductor layer which is located on the multilayered film and has a larger lattice constant than the first nitride semiconductor layer, wherein the semiconductor wafer has conductivity in a film-thickness direction.

Another aspect of the present invention is a semiconductor device, comprising: a semiconductor functional layer formed of nitride semiconductor in which both surfaces thereof are defined by a first main surface and a second main surface which faces the first main surface; a laminated body which is located on the second main surface and is conductive in a film-thickness direction, including a multilayered film having a structure in which nondoped first nitride semiconductor layers and nondoped second nitride semiconductor layers having a larger lattice constant than the first nitride semiconductor layer are laminated alternately, and a nondoped third nitride semiconductor layer which is located on the multilayered film and has a larger lattice constant than the first nitride semiconductor layer; and a pair of electrodes facing each other between the semiconductor functional layer and the laminated body.

DETAILED DESCRIPTION OF THE INVENTIONS

Figure 1:
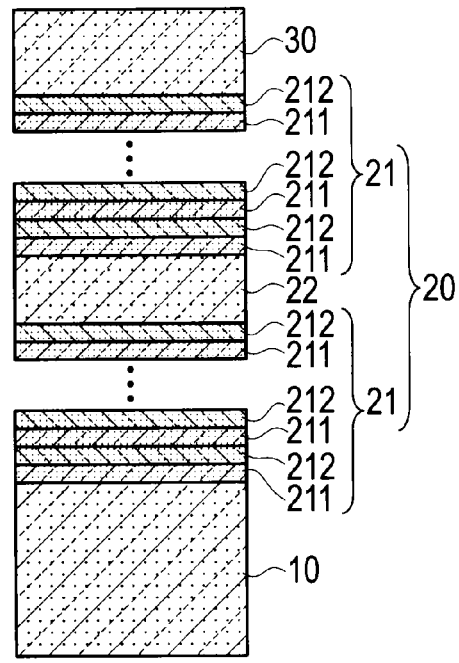
FIG. 1 is a schematic cross-sectional view showing a structure of a laminated body of a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

As illustrated in FIG. 1, a semiconductor device according to an embodiment of the present invention is provided with a multilayered film 21 having a structure in which a first nitride semiconductor layer 211 and a second nitride semiconductor layer 212 are stacked alternately, and a third nitride semiconductor layer 22 arranged on the multilayered film 21.

The first nitride semiconductor layer 211, the second nitride semiconductor layer 212, and the third nitride semiconductor layer 22 are made of a nitride semiconductor expressed as $Al_xGa_yIn_{1-x-y}N$ (0<$/$=x<$/$=1, 0<$/$=y<1, 0<x+y<$/$=1).

The first nitride semiconductor layer 211 and the second nitride semiconductor layer 212 are nondoped nitride semiconductor layers, and the lattice constant of the second nitride semiconductor layer 212 is larger than that of the first nitride semiconductor layer 211. Also, the multilayered film 21 has conductivity in the film thickness direction. The third nitride semiconductor layer 22 is a nondoped nitride semiconductor layer having a larger lattice constant than the first nitride semiconductor layer 211, and is conductive in the film thickness direction. The term "nondoped" here means that no impurity is added purposely.

While FIG. 1 shows an example where the multilayered films 21 are located above and below the third nitride semiconductor layer 22, respectively, a laminated body 20 may also be formed by a single layer of the multilayered film 21 and a single layer of the third nitride semiconductor layer 22. Alternatively, the laminated body 20 may have a plurality of the third nitride semiconductor layers 22 and the multilayered film 21 may be located between the third nitride semiconductor layers 22. By stacking the plurality of the third nitride semiconductor layers 22 and the plurality of the multilayered films 22 alternately, the thickness of the laminated body 20 serving as a conductive layer can be increased.

In the example illustrated in FIG. 1, the laminated body 20 in which the multilayered films 21 and the third nitride semiconductor layers 22 are stacked on each other is used as a buffer layer located between a semiconductor substrate 10 and a semiconductor functional layer 30. Explained below is an exemplary case where the laminated body 20 is used as a buffer layer.

Figure 2:
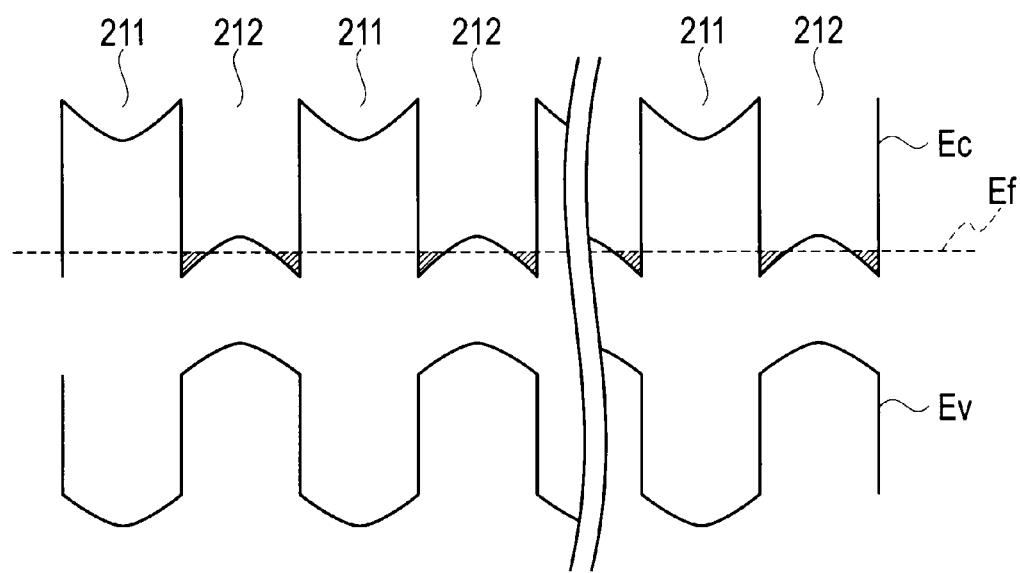
FIG. 2 is a schematic view showing an example of an energy band diagram of a multilayered film of the semiconductor device according to the embodiment of the present invention.

The first nitride semiconductor layer 211 and the second nitride semiconductor layer 212 are both nondoped. However, because of band offset generated in a sharp interface caused by compositions with different lattice constants, a conduction band Ec and a Fermi level Ef intersect as seen in the energy band diagram in FIG. 2. As a result, carrier is generated within the multilayered film 21 in the hatched areas where the conduction band Ec is lower than the Fermi level Ef. In FIG. 2, Ev represents a valence band. Note that FIG. 2 shows a case where the first nitride semiconductor layer 211 is made of an AlN film, and the second nitride semiconductor layer 212 is made of a GaN film.

The carrier generated in the multilayered film 21 as described above can travel in the planar direction along the interface surface between the first nitride semiconductor layer 211 and the second nitride semiconductor layer 212. This means that the multilayered film 21 has conductivity in the horizontal or planer direction.

The film thicknesses of the first nitride semiconductor layer 211 and the second nitride semiconductor layer 212 are set so that the carrier can pass in the film thickness direction due to a tunnel effect. More specifically, the film thickness of the first nitride semiconductor layer 211 is between around 1 nm and 8 nm, and the film thickness of the second nitride semiconductor layer 212 is between around 2 nm and 25 nm. Since the film thicknesses are small enough, the carrier generated in the multilayered film 21 can pass through the first nitride semiconductor layer 211 and the second nitride semiconductor layer 212 in the film thickness direction. Thus, the multilayered film 21 has conductivity in the vertical or film thickness direction.

Therefore, the multilayered film 21 has conductivity in the planer and film thickness directions.

As the lattice constant of the third nitride semiconductor layer 22 is larger than that of the first nitride semiconductor layer 211, the lattice constant of the third nitride semiconductor layer 22 is larger than an average value of the lattice constants of the layers included in the multilayered film 21. Hence, the bandgap energy of the third nitride semiconductor layer is smaller than an average value of bandgap energy of the layers included in the multilayered film 21.

Figure 3:
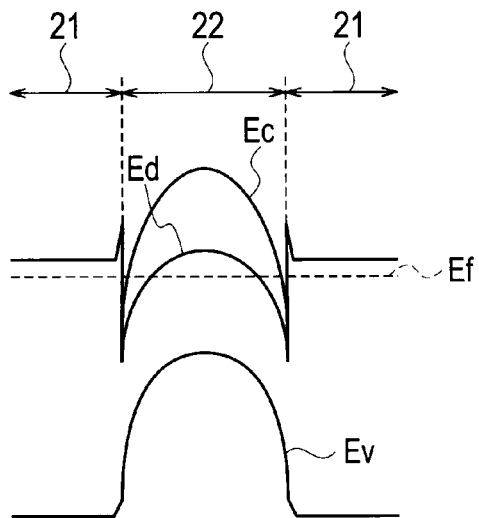
FIG. 3 is a schematic view showing an example of an energy band diagram of the laminated body of the semiconductor device according to the embodiment of the present invention.

The third nitride semiconductor layer 22 is nondoped, and a large energy barrier is generated in the conduction band Ec in the energy band diagram shown in FIG. 3. Therefore, the third nitride semiconductor layer 22 should have high resistance.

However, by bringing the third nitride semiconductor layer 22 into contact with the multilayered film 21, a large amount of dislocations generated in the multilayered film 21 is introduced into the third nitride semiconductor layer 22. Then, continuous crystal defects generated in the vicinity of the dislocations in the third nitride semiconductor layer 22 form a degenerated deep level Ed (see FIG. 3). Because carrier can travel via the deep level Ed, the third nitride semiconductor layer 22 shows high conductivity in the film thickness direction. Note that the Ev represents valence band in FIG. 3. Also, the conduction band Ec of the multilayered film 22 is mini band.

Nevertheless, when the film thickness of the third nitride semiconductor layer 22 is too small, a crack occurs in the crystal, making it unable to form the laminated body 20 with a large thickness. On the other hand, as the film thickness of the third nitride semiconductor layer 22 gets larger, internal dislocations are reduced, and resistance of the third nitride semiconductor layer 22 becomes higher.

Therefore, as described later, the film thickness of the third nitride semiconductor layer 22 in FIG. 1 is, for example, between 20 nm and 500 nm, and the number of the third nitride semiconductor layers 22 included in the laminated body 20 is set in accordance with a desired film thickness of the buffer layer. In order to form the semiconductor functional layer 30 with a good crystal quality and a large thickness, it is necessary to increase the film thickness of the buffer layer as well.

A semiconductor device having a desired function is manufactured by preparing a semiconductor wafer having a structure where the above-mentioned laminated body 20 is formed on the semiconductor substrate 10 and by locating the semiconductor functional layer 30 or the like on the laminated body 20. Described below is a case where a light-emitting diode (LED) 100 shown in FIG. 4 is manufactured by using the laminated body 20 shown in FIG. 1 as a buffer layer in which the multilayered films 21 and the third nitride semiconductor layers 22 are laminated.

Figure 4:
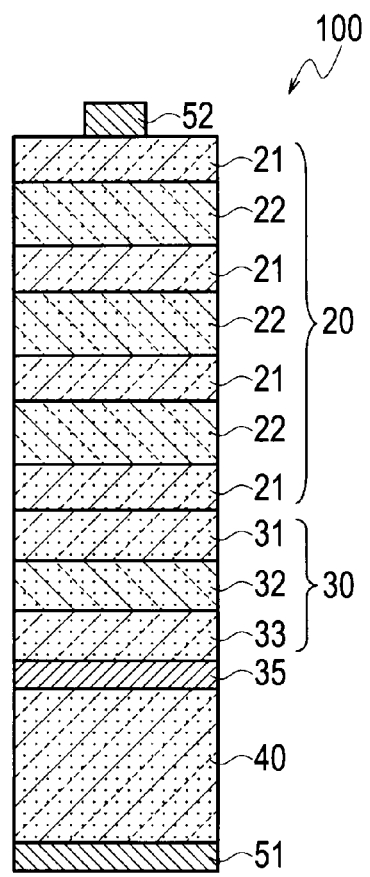
FIG. 4 is a schematic view showing a structure of a light-emitting diode using the laminated body shown in FIG. 1.

The LED 100 illustrated in FIG. 4 has a structure where the semiconductor functional layer 30 having a light-emitting function is located on a conductive support substrate 40, and the laminated body 20 formed as a buffer layer is located on the semiconductor functional layer 30. A reflective film 35 having conductivity is located between the support substrate 40 and the semiconductor functional layer 30. Further, a first electrode 51 is located on the back surface of the support substrate 40 and a second electrode 52 is located on the top surface of the uppermost layer of the laminated body 20.

The LED 100 illustrated in FIG. 4 is manufactured as follows. First of all, the laminated body 20 having a structure where the multilayered films 21 and the third nitride semiconductor layers 22 are stacked alternatively is formed on the semiconductor substrate 10. The number of pairs of the first nitride semiconductor layer 211 and the second nitride semiconductor layer 212 (hereinafter simply referred to as the number of pairs) that constitute the multilayered film 21 is about five. The first nitride semiconductor layer 211 is an AlN film with a film thickness of 4 nm, and the second nitride semiconductor layer 212 is a GaN film with a film thickness of 4 nm, for example. The third nitride semiconductor layer 22 is a GaN film having a film thickness of about 300 nm. When the second nitride semiconductor layer 212 and the third nitride semiconductor layer 22 are made of the same material, the third nitride semiconductor layer 22 is in contact with the first nitride semiconductor layer 211.

Next, the semiconductor functional layer 30 is formed on the laminated body 20. Further, after forming the reflective film 35 on the semiconductor functional layer 30, the support substrate 40 is laminated on the reflective layer 35. Thereafter, the semiconductor substrate 10 is removed. The first electrode 51 and the second electrode 52 are then formed, which completes the LED 100 shown in FIG. 4.

FIG. 4 illustrates a case where the laminated body 20 is structured by laminating four multilayered films 21 and three third nitride semiconductor layers 22 alternately. However, it should be naturally understood that the number of the multilayered films 21 and the third nitride semiconductor layers 22 that compose the laminated body 20 are not limited to the those numbers.

The semiconductor functional layer 30 is structured by stacking the nitride semiconductor layers. Specifically, in order to have a light-emitting diode with a double hetero junction structure, the semiconductor functional layer 30 has a structure where a light-emitting layer 32 is sandwiched between a first conductive layer 31 of a first conductive type and a second conductive layer 33 of a second conductive type.

For example, the first conductive layer 31 is an n-type nitride semiconductor layer, and the second conductive layer 33 is a p-type nitride semiconductor layer. In this case, the first conductive layer 31 is called an n-type clad layer, and is an n-type impurity doped GaN film with a film thickness of about 500 nm, for example. Meanwhile, the second conductive layer 33 is called a p-type clad layer, and is a p-type impurity doped AlGaN film with a film thickness of about 200 nm, for example.

The light-emitting layer 32 is, for example, a nondoped InGaN film having a film thickness of around 50 nm. Although the light-emitting layer 32 is illustrated as a single layer in FIG. 4, the light-emitting layer 32 has a multiple quantum well (MQW) structure in which barrier layers and well layers having smaller bandgap than the barrier layers are arranged alternately. Having said that, the light-emitting layer 32 may also be formed of a single layer. The light-emitting layer 32 may be omitted and the p-type first conductive layer 31 and the n-type second conductive layer 33 may be in contact with each other directly. Also, p-type or n-type conductive impurity may be doped in the light-emitting layer 32.

The support substrate 40 may be, for example, a silicon substrate having an n-type impurity concentration of between $5\times10^{18}$ cm$^{-3}$ and $5\times10^{19}$ cm$^{-3}$. The support substrate 40 has a resistivity of between around 0.0001 and 0.01 $\Omega\cdot$cm and serves as a current path between the first electrode 51 and the second electrode 52. Preferably, the support substrate 40 has a thickness of between around 300 and 1000 µm in order to mechanically support the laminated body 20 and the semiconductor functional layer 30.

As a current flows between the first electrode 51 and the second electrode 52 through the laminated body 20, the semiconductor functional layer 30, the reflective film 35, and the support substrate 40, electrons supplied from the n-type first conductive layer 31 and electron holes supplied from the p-type second conductive layer 33 are recombined in the light-emitting layer 32, thus emitting light. Light emitted out toward the laminated body 20 from the semiconductor functional layer 30 permeates the laminated body 20 and is outputted outside of the LED 100. Light emitted from the semiconductor functional layer 30 toward the support substrate 40 is reflected by the reflective film 35, permeates the semiconductor functional layer 30 and the laminated body 20, and is outputted outside of the LED 100.

Figure 5:
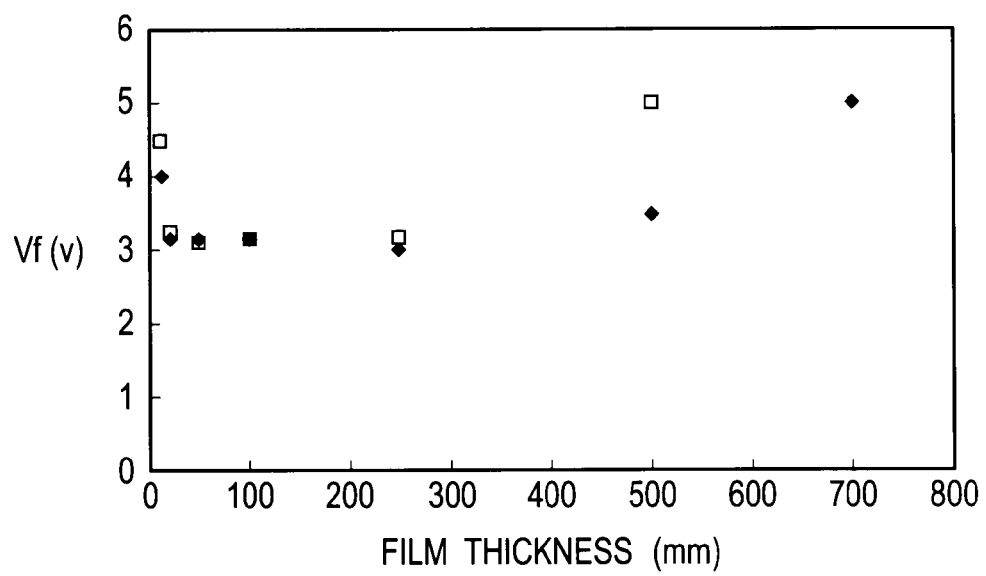
FIG. 5 is a graph showing a relation between a film thickness of a third nitride semiconductor layer and a forward voltage of the light-emitting diode of the semiconductor device according to the embodiment of the present invention.

FIG. 5 shows a relation between the film thickness of the third nitride semiconductor layer 22 and a forward voltage Vf of the light-emitting diode in which the forward current flows in the film thickness direction. In FIG. 5, values indicated by outlined squares are measured values in the case where the laminated body 20 has a structure in which the third nitride semiconductor layer 22 is located on the multilayered film 21. The values indicated by black diamond-shaped marks are measured values in the case where the laminated body 20 has a structure in which the multilayered film 21 is located on both above and beneath the third nitride semiconductor layer 22, respectively.

As shown in FIG. 5, by locating the third nitride semiconductor layer 22 on the multilayered film 21, the forward voltage Vf is low when the film thickness of the third nitride semiconductor layer 22 is in a range of 20 nm to 300 nm. In addition, by sandwiching the third nitride semiconductor layer 22 with the multilayered films 21, the forward voltage Vf is reduced when the film thickness of the third nitride semiconductor layer 22 is in a range of 20 nm to 500 nm, and the forward voltage Vf is even more decreased in the film-thickness range of 20 nm to 250 nm. Hence, the film thickness of the third nitride semiconductor layer 22 is preferably around 20 nm to 500 nm, and the film thickness of 20 nm to 250 is more preferred.

In order to increase conductivity of the third nitride semiconductor layer 22, it is effective to produce a large amount of dislocations in the multilayered film 21. To generate a great amount of dislocations in the multilayered film 21, it is preferred that a difference in lattice constant between the first nitride semiconductor layer 211 and the second nitride semiconductor layer 212 is 1% or higher. More preferably, the difference of the lattice constants is 2% or higher. Further, it is preferred that one of the first nitride semiconductor layer 211 and the second nitride semiconductor layer 212 has low flatness and the other one has high flatness during deposition.

Therefore, it is preferred that the composition of the first nitride semiconductor layer 211 is, for example, $Al_xGa_yIn_{1-x-y}N$ ($0.7<x<\!/\!=1$, $0<\!/\!=y<1$, $0<x+y<\!/\!=1$), and the composition of the second nitride semiconductor layer 212 is, for example, $Al_xGa_yIn_{1-x-y}N$ ($0<\!/\!=x<0.2$, $0<\!/\!=y<\!/\!=1$, $0<\!/\!=x+y<\!/\!=1$). More preferably, the first nitride semiconductor layer 211 is formed of an AlN film, and the second nitride semiconductor layer 212 is formed of a GaN film. In such case, the flatness of the first nitride semiconductor layer 211 is low during deposition, and a large amount of dislocations occur in an uneven portion. Nevertheless, the level of the flatness of the first nitride semiconductor layer 211 is not so low that the flatness is improved while depositing the second nitride semiconductor layer 212. Thus, the flatness of the multilayered film 21 can be maintained while generating a large amount of dislocations.

Further, in order to form appropriate unevenness, it is preferable that the deposition temperature of the first nitride semiconductor layer 211 composed of $Al_xGa_yIn_{1-x-y}N$ ($0.7<x</=1$, $0</=y<1$, $0<x+y</=1$) is 1200 degrees centigrade or lower. Also, in order to keep flatness of the multilayered film 21, it is preferred that the deposition temperature of the second nitride semiconductor layer 212 composed of $Al_xGa_yIn_{1-x-y}N$ ($0</=x<0.2$, $0</=y</=1$, $0</=x+y</=1$) is 900 degrees centigrade or higher. Considering productivity, it is effective that the first nitride semiconductor layer 211 and the second nitride semiconductor layer 212 are deposited at the same temperature. Hence, the deposition temperature of the first nitride semiconductor layer 211 and the second nitride semiconductor layer 212 is preferably 900 to 1200 decrees centigrade, and 1000 to 1100 degrees centigrade is more preferred.

Figure 6:
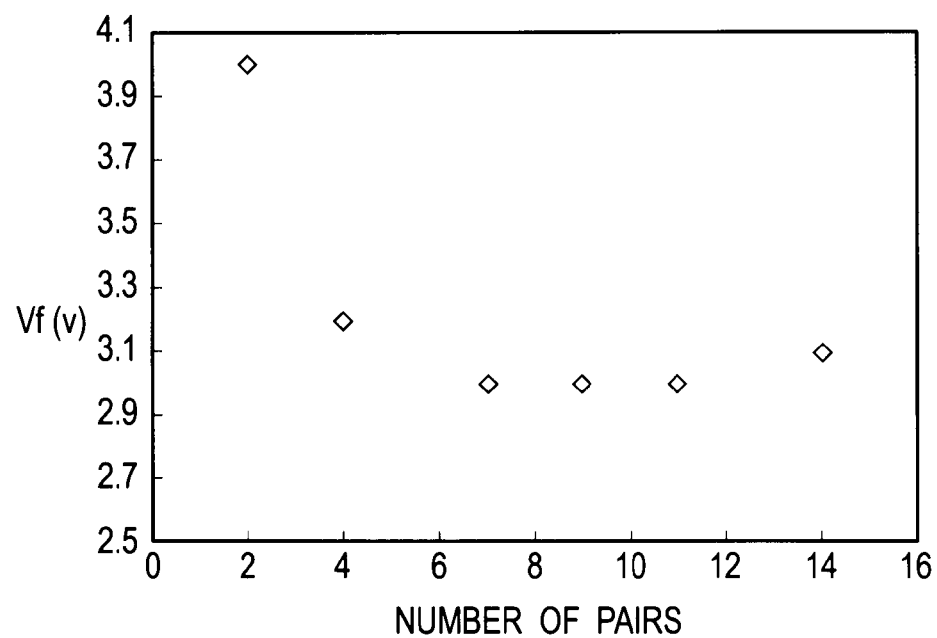
FIG. 6 is a graph showing a relation between the number of pairs in the multilayered film and the forward voltage of the light-emitting diode of the semiconductor device according to the embodiment of the present invention.

Also, as shown in FIG. 6, in order to lower the forward voltage Vf, at least 3 pairs of the first nitride semiconductor layer 211 and the second nitride semiconductor layer 212 are necessary. The preferred number of pairs thereof is 5 to 15, and 8 to 12 pairs are more preferred. FIG. 6 shows measured values in a case where the third nitride semiconductor layer 22 with the film thickness of 200 nm is located on the multilayered film 21.

Figure 7:
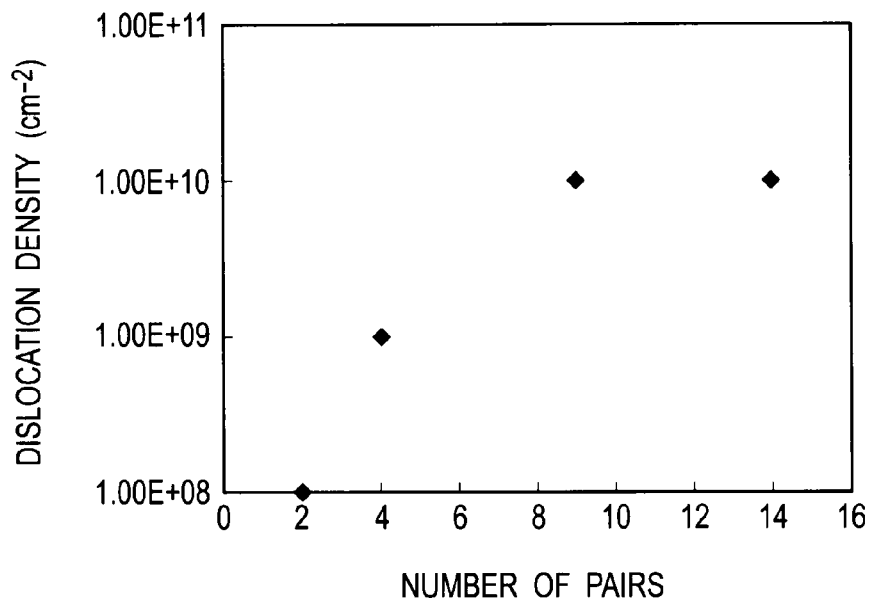
FIG. 7 is a graph showing a relation between the number of pairs in the multilayered film and a dislocation density of the third nitride semiconductor layer of the semiconductor device according to the embodiment of the present invention.

FIG. 7 shows a relation between the number of pairs in the multilayered film 21 and the dislocation density of the third nitride semiconductor layer 22. Similarly to FIG. 6, FIG. 7 shows measured values in a case where the third nitride semiconductor layer 22 with the film thickness of 200 nm is located on the multilayered film 21. As shown in FIG. 6, the preferred number of pairs is 5 to 15, and the number of pairs between 8 and 12 is more preferred. Therefore, according to the relation shown in FIG. 7, the dislocation density of the third nitride semiconductor layer 22 to obtain excellent conductivity is $1 \times 10^8$ cm$^{-2}$ or higher, preferably $1 \times 10^9$ cm$^{-2}$ or higher. $1 \times 10^{10}$ cm$^{-2}$ is even more preferred. When the dislocation density of the third nitride semiconductor layer 22 is within the above-mentioned range, a large amount of dislocations generated in the multilayered film 21 are well inherited into the third nitride semiconductor layer 22.

By forming the laminated body 20 as described above, a nondoped conductive layer can be realized, and degradation of crystal quality and occurrence of cracks due to impurity doping are thus inhibited. For instance, even if a thick epitaxial layer with a thickness of 3 μm or larger is formed, development of cracks are reduced, thus enabling to manufacture a quality electronic device.

For example, by stacking the multilayered films 21 and the third nitride semiconductor layers 22 alternately, a conductive layer having a buffer layer with a thickness of 2 μm or larger can be realized with less developments of cracks. According to the laminated body 20, even if the entire thickness thereof is 3 μm or larger as a nitride semiconductor layer formed with epitaxial growth, the laminated body 20 can be formed with reduced warpage and no cracks.

Figure 8:
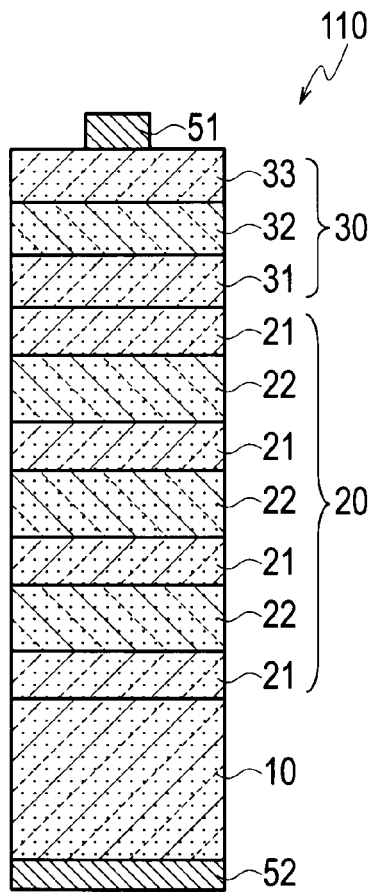
FIG. 8 is a schematic view showing another structure of the light-emitting diode using the laminated body shown in FIG. 1.

Explanation provided with reference to FIG. 4 was about the LED 100 having a laminated reflective structure. However, as illustrated in FIG. 8, the structure may be such that, for example, the laminated body 20 is located as a buffer layer on the semiconductor substrate 10 which is a silicon substrate, and a semiconductor functional layer 30 having a light-emitting function is arranged on the laminated body 20. In the LED 100 in FIG. 8, a current also flows between the first electrode 51 and the second electrode 52 through the laminated body 20 and the semiconductor functional layer 30. Thus, light is emitted from the light-emitting layer 32 and outputted outside through a second conductive layer 33.

However, in the LED 100 illustrated in FIG. 8, light outputted from the light-emitting layer 32 toward the first conductive layer 31 is absorbed in the semiconductor substrate 10 and the like. Therefore, this LED 100 is inferior in the light-emitting efficiency to the LED 100 in FIG. 4.

Figure 9:
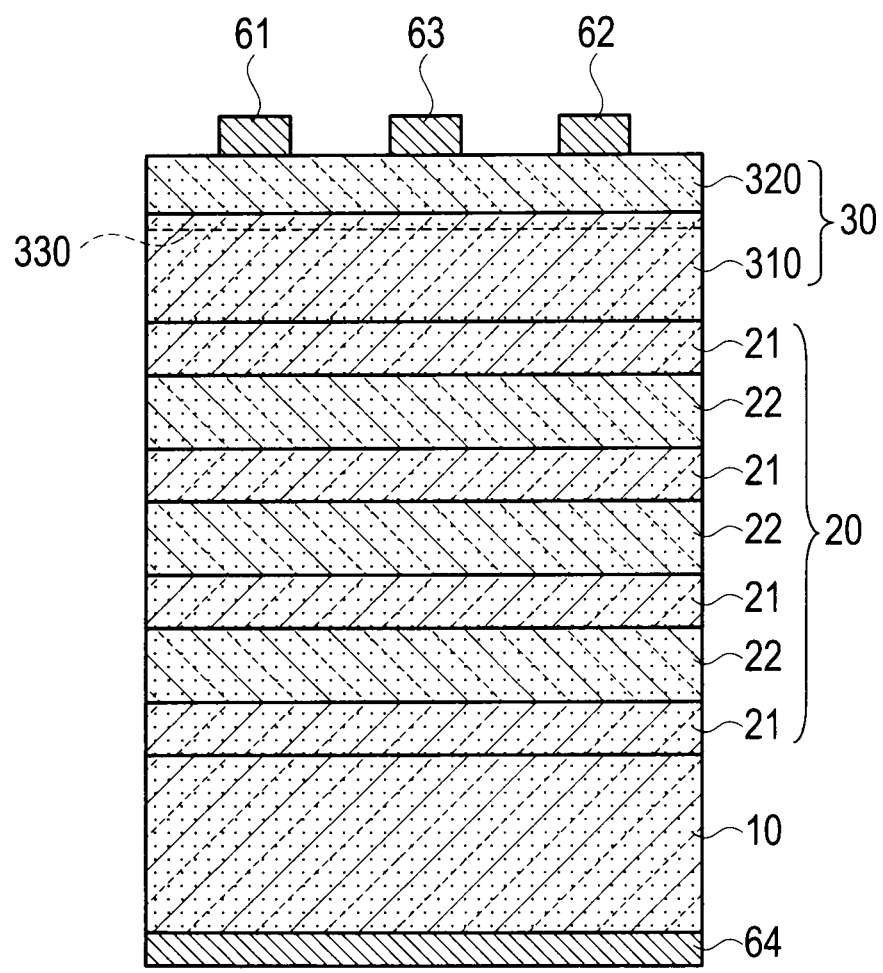
FIG. 9 is a schematic view showing another structure of a semiconductor device according to the embodiment of the present invention.

Described so far was an example of a semiconductor device in which the semiconductor functional layer 30 has a light-emitting function and a current flows in the film-thickness (vertical) direction. FIG. 9 shows an example in which the semiconductor functional layer 30 has a function other than a light-emitting function. In the example shown in FIG. 9, the laminated body 20 is used as a buffer layer of a high electron mobility transistor (HEMT).

The semiconductor functional layer 30 in FIG. 9 includes a carrier travel layer 310 and a carrier supply layer 320 having different bandgap energy from the carrier travel layer 310. A two-dimensional carrier gas layer 330 is formed as a current path (channel) in the carrier travel layer 310 in the vicinity of the hetero junction surface with the carrier supply layer 320.

The carrier travel layer 310 is formed by, for example, epitaxial growth of nondoped GaN with no impurity added to have a thickness of around 200 nm by means of MOCVD or the like.

The carrier supply layer 320 has a larger bandgap than the carrier travel layer 310, and is made of nitride semiconductor having different lattice constant from the carrier travel layer 310. The carrier supply layer 320 is, for example, nitride semiconductor expressed as $Al_xGa_yM_{1-x-y}N$ ($0</=X<1$, $0</=y<1$, $0</=x+y</=1$ where M represents indium (In), boron (B), etc.). Also, nondoped $Al_xGa_{1-x}N$ is also used as the carrier supply layer 320. Further, nitride semiconductor composed of $Al_xGa_{1-x}N$ with n-type impurity added can also be used for the carrier supply layer 320. The film thickness of the carrier supply layer 320 is around 10 to 50 nm, and is approximately 20 nm, for example. On the carrier supply layer 320, a source electrode 61, a drain electrode 62, a gate electrode 63 are located.

The semiconductor substrate 10 is a conductive substrate, and is made of, for example, silicon. Since the laminated body 20 located between the semiconductor substrate 10 and the semiconductor functional layer 30 has conductivity, the semiconductor substrate 10 can be set to a desired electric potential by an electrode for control of electrical field 64 arranged on the back surface of the semiconductor substrate 10. For example, the semiconductor substrate 10 can be set to the same electric potential as the source electrode 61 or the gate electrode 63. Alternatively, the semiconductor substrate 10 can be set to a floating potential.

When using a silicon substrate as the semiconductor substrate 10, it is preferred that a conductive type of the silicon substrate be determined in accordance with the conductive type of an epitaxial layer such as the laminated body 20 which is in contact with the silicon substrate. For example, in the case of forming an n-type nitride semiconductor layer on the silicon substrate, use of a p-type silicon substrate can reduce contact resistance between the silicon substrate and the nitride semiconductor layer as described below.

When an n-type nitride semiconductor layer is formed on a p-type silicon substrate, there is an interface state in the hetero junction interface between the silicon substrate and the nitride semiconductor layer. Further, when a layer is formed which has a quantum-mechanical tunnel effect between the silicon substrate and the nitride semiconductor layer (hereinafter referred to as an intermediate layer), an interface state exists between the p-type silicon substrate and the n-type nitride semiconductor layer via the intermediate layer. The interface state represents an energy level that contributes to electric conduction between the n-type nitride semiconductor layer and the p-type silicon substrate. Because of the existence of the interface state, carrier (electrons) within the p-type silicon substrate is poured well into the n-type nitride semiconductor layer via the interface state. As a result, the potential barrier of the hetero junction between the p-type silicon substrate and the n-type nitride semiconductor layer or the potential barrier of the interface between the p-type silicon substrate and the n-type nitride semiconductor layer via the intermediate layer having the quantum-mechanical tunnel effect becomes smaller. Thus, the contact resistance between the silicon substrate and the nitride semiconductor layer is reduced.

As described so far, according to the embodiment of the present invention, by forming the laminated body 20 in which the nondoped multilayered films 21 and the nondoped third nitride semiconductor layers 22 are laminated, a semiconductor wafer can be realized which has the laminated body 20 with conductivity and a large thickness while inhibiting cracks.

Further, by forming the semiconductor functional layer 30 and the like on the laminated body 20 of the above-mentioned semiconductor wafer and locating a pair of electrodes which face each other through the laminated body 20 and the semiconductor functional layer 30, a semiconductor device can be realized which has the laminated body 20 as a nitride semiconductor layer with conductivity and a large thickness while suppressing occurrence of cracks. This semiconductor device is obtained by chipping the aforementioned wafer, and a current can flow between the electrodes via the semiconductor functional layer 30 and the laminated body 20 in the film thickness direction.

OTHER EMBODIMENTS

Although the third nitride semiconductor layer 22 was a single layer in the case explained above, the third nitride semiconductor layer 22 may also be structured with a plurality of layers. In that case, the third nitride semiconductor layer 22 can be formed by a plurality of layers with different lattice constants, but the material for each of the layers that constitute the third nitride semiconductor layer 22 should be selected so that dislocations are inherited well between layers.

Various modifications will become possible for those skilled in the art after receiving the teachings of the present disclosure without departing from the scope thereof.

What is claimed is:
1. A semiconductor wafer comprising:
a multilayered film having a structure in which nondoped first nitride semiconductor layers and nondoped second nitride semiconductor layers with a larger lattice constant than the first nitride semiconductor layer are laminated alternately; and
a nondoped third nitride semiconductor layer which is located on the multilayered film and has a larger lattice constant than the first nitride semiconductor layer,
wherein the semiconductor wafer has conductivity in a film-thickness direction, and
a plurality of the multilayered films are included, and the multilayered film is located both above and underneath the third nitride semiconductor layer.

2. The semiconductor wafer according to claim 1, wherein at least three layers of both the first nitride semiconductor layers and the second nitride semiconductor layers are laminated in the multilayered film.

3. The semiconductor wafer according to claim 1, wherein a plurality of the third nitride semiconductor layers are included.

4. The semiconductor wafer according to claim 1, wherein the first nitride semiconductor layer and the second nitride semiconductor layer have film thicknesses which allow carrier to pass through in the film-thickness direction due to a tunnel effect.

5. A semiconductor device, comprising:
a semiconductor functional layer formed of nitride semiconductor in which both surfaces thereof are defined by a first main surface and a second main surface which faces the first main surface;
a laminated body which is located on the second main surface and is conductive in a film-thickness direction, including a multilayered film having a structure in which nondoped first nitride semiconductor layers and nondoped second nitride semiconductor layers having a larger lattice constant than the first nitride semiconductor layer are laminated alternately, and a nondoped third nitride semiconductor layer which is located on the multilayered film and has a larger lattice constant than the first nitride semiconductor layer; and
a pair of electrodes facing each other through the semiconductor functional layer and the laminated body
wherein the laminated body includes a plurality of the multilayered films, and the multilayered film is located both above and underneath the third nitride semiconductor layer.

6. The semiconductor device according to claim 5, wherein a current flows between the pair of electrodes in the film-thickness direction through the semiconductor functional layer and the laminated body.

* * * * *